United States Patent [19]

Aigo

[11] Patent Number: 4,489,502

[45] Date of Patent: Dec. 25, 1984

[54] SPIN DRIER FOR SILICON WAFERS AND THE LIKE

[76] Inventor: Seiichiro Aigo, 2-15-13, Negishi, Daito-ku, Tokyo, Japan

[21] Appl. No.: 438,973

[22] Filed: Nov. 3, 1982

[51] Int. Cl.³ .............................................. F26B 11/18
[52] U.S. Cl. ............................................ 34/8; 34/58; 34/69; 34/187
[58] Field of Search ....................... 34/57 E, 58, 8, 69, 34/187, 188

[56] References Cited

U.S. PATENT DOCUMENTS

| | | | |
|---|---|---|---|
| 3,152,875 | 10/1964 | Davis et al. | 34/58 |
| 3,246,404 | 4/1966 | O'Connor | 34/58 |
| 3,566,582 | 3/1971 | Yankura | 34/57 E |
| 4,087,924 | 5/1978 | Fujimoro et al. | 34/58 |

Primary Examiner—Larry I. Schwartz
Assistant Examiner—David W. Westphal
Attorney, Agent, or Firm—McGlew and Tuttle

[57] ABSTRACT

Disclosed herein is a spin drier for silicon wafers and the like including a rotor equipped with at least one holder for a carrier, which is adapted to enclose a silicon wafer or the like therein, and a casing embracing the rotor. The spin drier is further provided with a guide member, which is disposed between the lower face of the rotor and the bottom wall of the casing and formed of a plurality of guide blades extending downwardly aslant in the rotating direction of the rotor. Owing to the provision of the guide member, water and dusts are prevented from splashing back onto the wafers or the like from the bottom wall of the casing. Thus, the wafers or the like can be dried faster without deleteriously affecting the washing effect.

4 Claims, 8 Drawing Figures

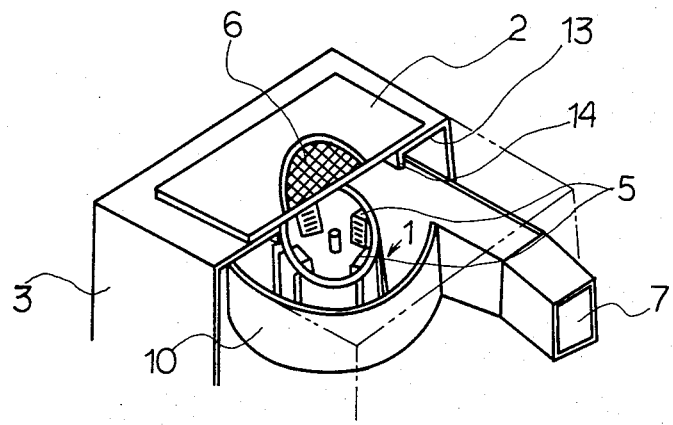
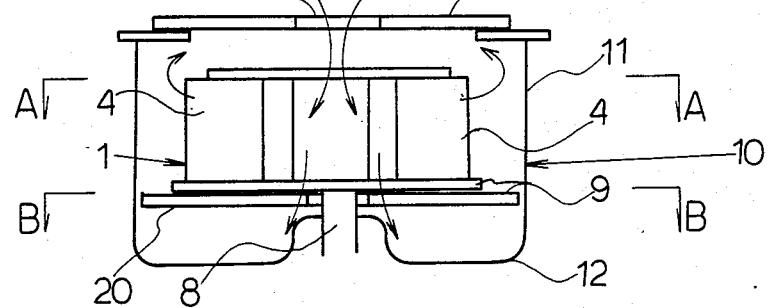
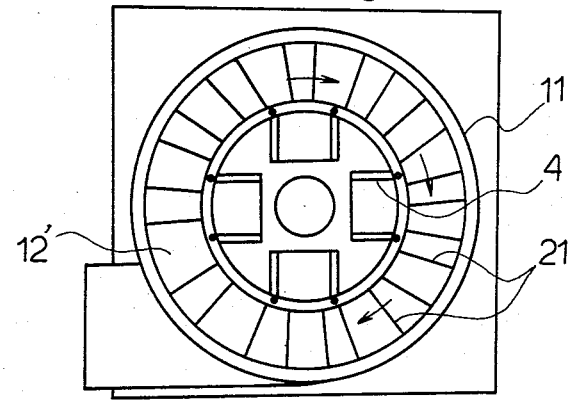

SPIN DRIER FOR SILICON WAFERS AND THE LIKE

BACKGROUND OF THE INVENTION

1. Field of the Invention

This invention relates to an improvement in or relating to an apparatus adapted to remove water droplets stuck on the surface of a silicon wafer, glass photomask or the like by a centrifugal force and to dry same.

2. Description of the Prior Art

The above apparatus is used, after washing a silicon wafer or the like with water, to remove water and to dry the silicon wafer of the like. It is constructed of a rotor to be driven and a generally cylindrical casing which embraces the rotor. The rotor is provided with one or more holders each adapted to hold a cage-shaped carrier which is used to enclose an item to be treated (e.g., a wafer), namely a carrier holder. On the other hand, a lid centrally defining an air intake port is provided over the casing while an exhaust port is formed in the circumferential wall of the casing at a suitable location thereof. When the rotor is driven, water droplets present on the surface of a wafer or the like are thrown off in an air stream by virtue of centrifugal forces applied thereto toward the circumferential wall of the casing and are then collected on the bottom wall of the casing. Since a negative pressure is developed at this time in a central region of the rotor, air is drawn into the rotor through the air intake port and is then caused to flow in a circumferential direction through the casing, and is eventually discharged through the exhaust port. The wafer or the like is thus dried up by the air stream.

Accordingly, besides water droplets, dusts and stains are also caused to stick on the circumferential wall of the casing and are then allowed to drip down, thereby causing such dusts and stains to accumulate on the bottom wall of the casing. In an apparatus of the above type, the air in the casing does not flow in its entirety in the circumferential direction but a part of the air may flow in the radial direction and/or may swirl upwardly. In some instances, air streams which flow in the radial direction or swirl upwardly strike against the circumferential wall and against the bottom wall and flow backward, thereby carrying water, dusts and stains on the circumferential wall and on the bottom wall back onto the wafer or the like. Such a prior art apparatus is thus accompanied by drawbacks that such radial air flows and/or upward air swirls lower the drying efficiency and affect adversely on the effectiveness of the washing treatment.

SUMMARY OF THE INVENTION

An object of this invention is to provide a spin drier which is capable of preventing water, dusts and stains accumulated on the bottom wall of its casing from splashing backward and thus enhancing the drying efficiency.

In order to achieve the above object, main features of the present invention reside in that air streams have been prevented from striking against the bottom wall of the casing and the drainage of water has been effectively carried out.

Accordingly, the present invention provides a spin drier for silicon wafers and the like including a rotor equipped with at least one holder for a carrier, which is adapted to enclose a silicon wafer or the like therein, and a casing embracing the rotor, said spin drier comprising a guide member provided between the lower face of the rotor and the bottom wall of the casing and formed of a plurality of guide blades extending downwardly aslant in the rotating direction of the rotor.

The above and other objects, features and advantages of the present invention will become apparent from the following description and the appended claims, taken in conjunction with the accompanying drawings.

BRIEF DESCRIPTION OF THE DRAWINGS

FIG. 1 is a perspective view of one embodiment of the spin drier according to this invention;

FIG. 2 is a vertical cross-sectional view of its rotor and casing;

FIG. 3 is a cross-sectional view taken along line A—A of FIG. 2;

DETAILED DESCRIPTION OF THE INVENTION AND PREFERRED EMBODIMENTS

Figure 4:
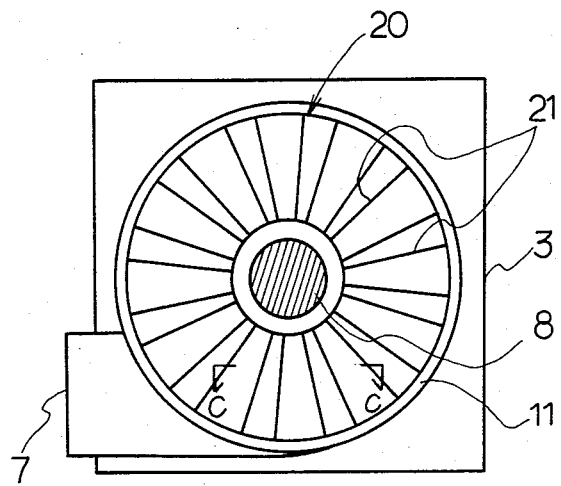
FIG. 4 is a cross-sectional view taken along line B—B of FIG. 2.

FIG. 1 illustrates the overall construction of one embodiment of the spin drier according to this invention. Designated at numeral 1 is a rotor, which is enclosed in a casing 10. The rotor 1 and casing 10 are housed in an external housing 3 which is provided with a freely openable lid 2 at a location on the casing 10. As shown more clearly in FIG. 2, the rotor 1 is provided with a suitable number of holders 4 adapted to fixedly hold their corresponding carriers. In the illustrated embodiment, four holders are provided. Needless to say, the number of such holders is not limited to four but may be either one or any other number. As depicted in FIG. 1, items to be treated, namely, silicon wafers, glass photomasks or the like are separately enclosed in their respective carriers 5, which are then held in place by holders 4 of the rotor 1. The lid 2 centrally defines an air intake port 6 which is covered by a screen. An air exhaust port 7 is provided in a circumferential wall 11 of the casing 10 at a suitable location. Air, which has been introduced through the intake port 6 owing to rotation of the rotor 1, is caused to flow through the casing 10 and eventually to flow out through the exhaust port 7. Incidentally, as illustrated in FIG. 2, the rotor 1 is connected at the center thereof with a drive shaft 8 which can be rotated by means of a motor or the like.

Figure 5:
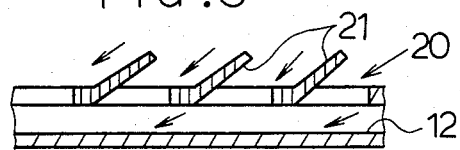
FIG. 5 is a cross-sectional view taken along line C—C of FIG. 4.
Figure 6:
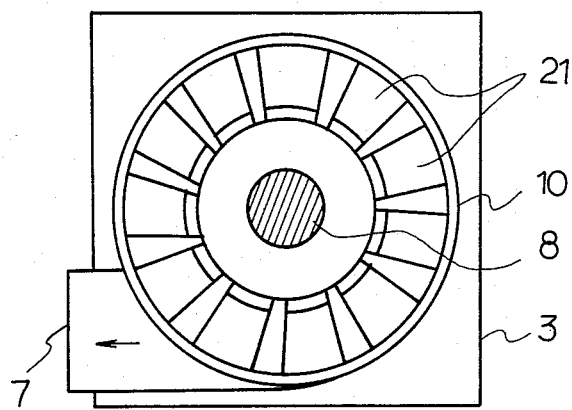
FIG. 6 is a cross-sectional view similar to FIG. 4 but showing another embodiment of the spin drier according to this invention.

The main features of this invention resides, as shown in FIGS. 2 to 5, in that a guide member 20 formed of a number of guide blades is provided between the lower face 9 of the rotor 1 and the bottom wall 12 of the casing 10, whereby to prevent air from swirling upwardly from the bottom wall 12 of the casing 10. As depicted in FIG. 5, each of the guide blades 21 extends downwardly aslant in the rotating directoin of the rotor 1. The angle of its inclination is not limited specifically, but about 20–45 degree is preferred. Although the guide member 20 formed of a suitable number of the guide blades 21 may be formed as an integral unit by virtue of the press-forming technique or the like, it may be constructed of separate guide blades. It is desirous, as depicted in FIG. 6, that the guide blades 21 are provided with the substantially equal interval in the circumferential direction. These guide blades 21 are disposed, normally, with their longitudinal axes extending in the radial directions. Their longitudinal axes may however be shifted from the radial directions to a certain extent. The guide blades 21 extend preferably from points near the drive shaft 8 of the rotor 1 to the circumferential wall 11 of the casing 10. However, in some instances, it is still feasible to provide the guide blades 21 only in an outer circumferential region. Namely, as seen in FIG. 6, it may be possible to use as the guide blades 21 relatively short guide blades which extend radially from approximately the midpoints between the drive shaft 8 of the rotor 1 and the circumferential wall 11 of the casing 10 to the circumferential wall 11 of the casing 10.

Figure 8:
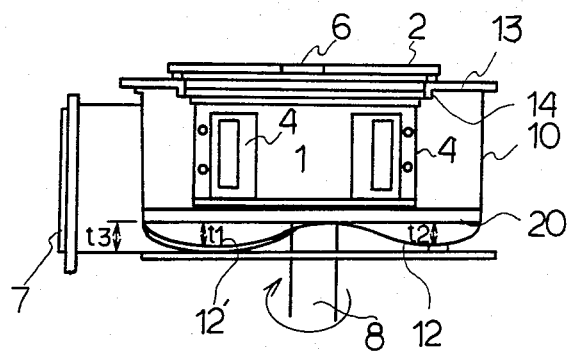
FIG. 8 is a cross-sectional view similar to FIG. 2 but illustrating a still further embodiment of the spin drier according to this invention.

Furthermore, it is preferable to make the bottom wall 12 higher around its central portion, through which the drive shaft 8 extends, and lower along the circumferential edge thereof as shown in FIG. 8. It is preferable to make the height of the air exhaust port 7 substantially equal to the toroidal air flow conduit formed in the casing 10, because the resistance to an air stream flowing through the conduit can be reduced. It may also be feasible, as shown in FIG. 8, to provide a circular pendant wall 14 along the inner circumferential edge of the top wall 13 of the casing 10. Provision of such a circular pendant wall serves to prevent air from flowing back downwardly into the central region of the rotor 1.

In order to remove water from silicon wafers and dry same by the above spin drier, the silicon wafers are placed in the carriers 5 and the carriers 5 are then attached to the holders 4 of the rotor 1. After closing the lid 2, the rotor 1 is rotated. Each of the wafers is rotated due to the rotation of the rotor 1 and water droplets stuck on the wafer are thrown off toward the periphery owing to centrifugal forces applied thereto, thereby removing the water droplets from the wafers. At the same time, a negative pressure is developed in a central region of the rotor 1 and induces fresh air to flow in through the intake port 6. The thus-introduced air then flows outwardly in the radial direction through spacings between the wafers and, thereafter, in the circumferential direction along the circumferential wall 11 of the casing 10, and is finally discharged through the exhaust port 7. Thus, the wafers are dried up by such an air stream. Water droplets stuck on the circumferential wall 11 of the casing 10 are then allowed to drip and are collected on the bottom wall 12 of the casing 10. In the casing 10, besides circumferentially-flowing air streams, there are air streams flowing downwardly. However, these downward air streams are guided by each of the guide blades 21 and reach the bottom wall 12. Even when water droplets are splashed backward from the bottom wall 12, they are prevented from flowing upwardly owing to the provision of the guide blades 21. Accordingly, water droplets are caused to flow in the circumferential direction toward the air exhaust port 7 underneath the guide member 20. Since each air stream, which has hit against the bottom wall 12, is prevented from swirling backward to an upper part in the casing 10, no water or dusts will be lifted back upwardly from the bottom wall 12 to the wafers. The guide member 20 also serves to cause water, which has accumulated on the bottom wall 12, to flow to the exhaust port 7.

Figure 7:
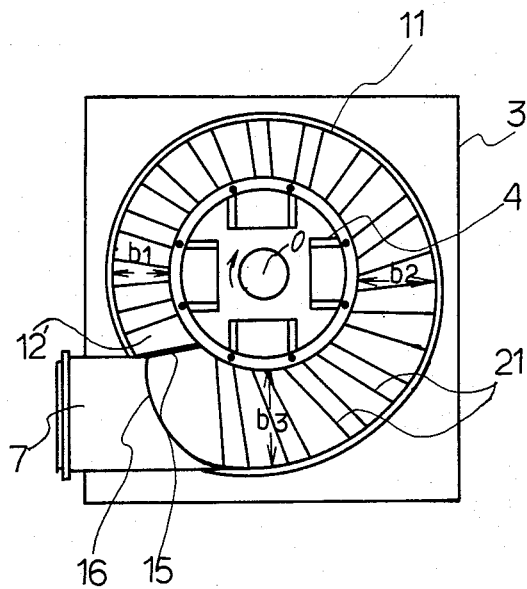
FIG. 7 is a cross-sectional view similar to FIG. 3 but showing a further embodiment of the spin drier according to this invention.

In addition, it is preferable to construct the circumferential wall 11 of the casing 10 in such a way that, as illustrated in FIG. 7, the radial distance between the circumferential wall 11 and the central axis 0 of the rotor 1 gradually increases as the circumferential wall 11 extends all around the rotor 1 from a position 12' adjacent to the exhaust port 7 to the exhaust port 7. Also, as shown in FIG. 8, it is preferable that the bottom wall 12 of the casing 10 gradually slopes down all along the circumferential wall 11 from the position 12' toward the exhaust port 7. Thus, the conduit width b1 at the position 12' of the casing 10 is narrower than the conduit width b2 at a position diametrically opposite to the position 12'. The conduit width b2 is in turn narrower than the conduit width b3 at a position slightly upstream the exhaust port 7. Supposing the depth of the bottom wall 12 from the lower face of the rotor 1 be t1, t2 and t3 respectively at the position 12', the position diametrically opposite to the position 12', and the position slightly upstream the exhaust port 7, $t1 < t2 < t3$ as shown in FIG. 8. Thus, a step 15 is formed at a position adjacent to the exhaust port 7. Owing to the above-described construction of the casing 10, the circumferential air conduit defined by the casing 10 becomes wider in its cross-sectional area as it approaches toward the exhaust port 7, thereby reducing the resistance to an air stream to be flown therethrough and facilitating the intake and exhaust of air and achieving still smoother drainage of water from the bottom wall 12.

In certain instances, it may still be possible, as illustrated in FIG. 7, to provide a guide plate 16 at a position right upstream the exhaust port 7 and lower than the level of the rotor 1, in place of its corresponding guide blades. This guide plate 16 has a horizontal portion lying at the same height as the guide member 20 and a vertical portion closing up the gap between the step 15 and the guide member 20. It thus serves to guide an air stream underneath the guide member 20 in its entirety to the exhaust port 7.

As described above, the present invention is capable of preventing water and dusts, which have accumulated on the bottom wall of the casing, from splashing back and suitably promoting the drainage of water owing to the provision of the guide blades between the rotor and the bottom wall of the casing. Therefore, the present invention can carry out the drying of wafers or the like in a shorter period of time. In addition, the washing effects are not deleteriously affected owing to the prevention of dust splashes.

Having now fully described the invention, it will be apparent to one of ordinary skill in the art that many changes and modifications can be made thereto without departing from the spirit or scope of the invention as set forth herein.

What is claimed is:

1. In a spin drier for silicon wafers and the like including a rotor having a lower face and equipped with at least one holder for a carrier, which is adapted to enclose a silicon wafer or the like therein, and a casing embracing the rotor and having a bottom wall and a circumferential wall, the improvement which comprises a guide member provided between the lower face of the rotor and the bottom wall of the casing and formed of a plurality of guide blades extending downwardly slanted in the rotating direction of the rotor, the radial distance between the circumferential wall of the casing and a central axis of the rotor gradually increases as the circumferential wall extends around the central axis of the rotor in the circumferential direction from a position adjacent an air exhaust port provided at a selected location in the circumferential wall of the casing to the air exhaust port, the bottom wall of the casing gradually sloping down all around the central axis of the rotor in the circumferential direction from a position adjacent the air exhaust port, to the air exhaust port.

2. A spin drier as claimed in claim 1, wherein each of the guide blades extends from a point near a drive shaft of the rotor to the circumferential wall of the casing.

3. A sping drier as claimed in claim 1, wherein each of the guide blades extends from approximately, a midpoint between the central axis of the rotor and the circumferential wall of the casing, to the circumferential wall of the casing.

4. A spin drier as claimed in claim 1, wherein a guide plate is provided at a position right upstream the air exhaust port location at a suitable location so that an air stream underneath the guide member is guided to the air exhaust port.

* * * * *